United States Patent
Tsai et al.

(10) Patent No.: US 8,666,710 B2
(45) Date of Patent: Mar. 4, 2014

(54) METHOD FOR CALIBRATING THE CRYSTAL-LEVEL DETECTION EFFICIENCY

(75) Inventors: Tien-Hsiu Tsai, Taoyuan County (TW); Meei-Ling Jan, Toayuan County (TW); Yu-Ching Ni, Taoyuan County (TW)

(73) Assignee: Institute of Nuclear Energy Research Atomic Energy Council, Executive Yuan, Taoyuan County (TW)

(*) Notice: Subject to any disclaimer, the term of this patent is extended or adjusted under 35 U.S.C. 154(b) by 891 days.

(21) Appl. No.: 12/840,627

(22) Filed: Jul. 21, 2010

(65) Prior Publication Data
US 2011/0106473 A1 May 5, 2011

(30) Foreign Application Priority Data
Oct. 30, 2009 (TW) ................ 98136868 A

(51) Int. Cl.
G06G 7/48 (2006.01)
G06G 7/56 (2006.01)
G06F 17/50 (2006.01)

(52) U.S. Cl.
CPC ................ *G06F 17/5018* (2013.01)
USPC ................ 703/5; 703/2; 702/28

(58) Field of Classification Search
USPC ................ 703/2, 5; 702/28, 40
See application file for complete search history.

(56) References Cited

U.S. PATENT DOCUMENTS
2011/0202324 A1* 8/2011 Currell et al. .......... 703/2

OTHER PUBLICATIONS

Levin. "Design of a High-Resolution and High-Sensitivity Scintillation Crystal Array for PET with Nearly Complete Light Collection"., IEEE 2002., p. 2236-2243.*
Shah et al. ("Position-Sensitive Avalanceh Photodiodes for Gamma-Ray Imaging". IEEE 2002., p. 1687-2002.*

* cited by examiner

Primary Examiner — Eunhee Kim
(74) Attorney, Agent, or Firm — WAPT, PC; Justin King

(57) ABSTRACT

The present invention provides a method for calibrating the crystal-level detection efficiency, which is capable of evaluating the influences caused by the penetration effect of the crystals of a scintillation detector so as to calculate the difference of detection efficiency between crystals correctly and thereby calibrate the difference between crystals appropriately such that the quality of the imaging result is improved accordingly. The method of present invention is simple without modifying the hardware design and consequently the design cost, manpower cost and time cost can be reduced.

17 Claims, 6 Drawing Sheets

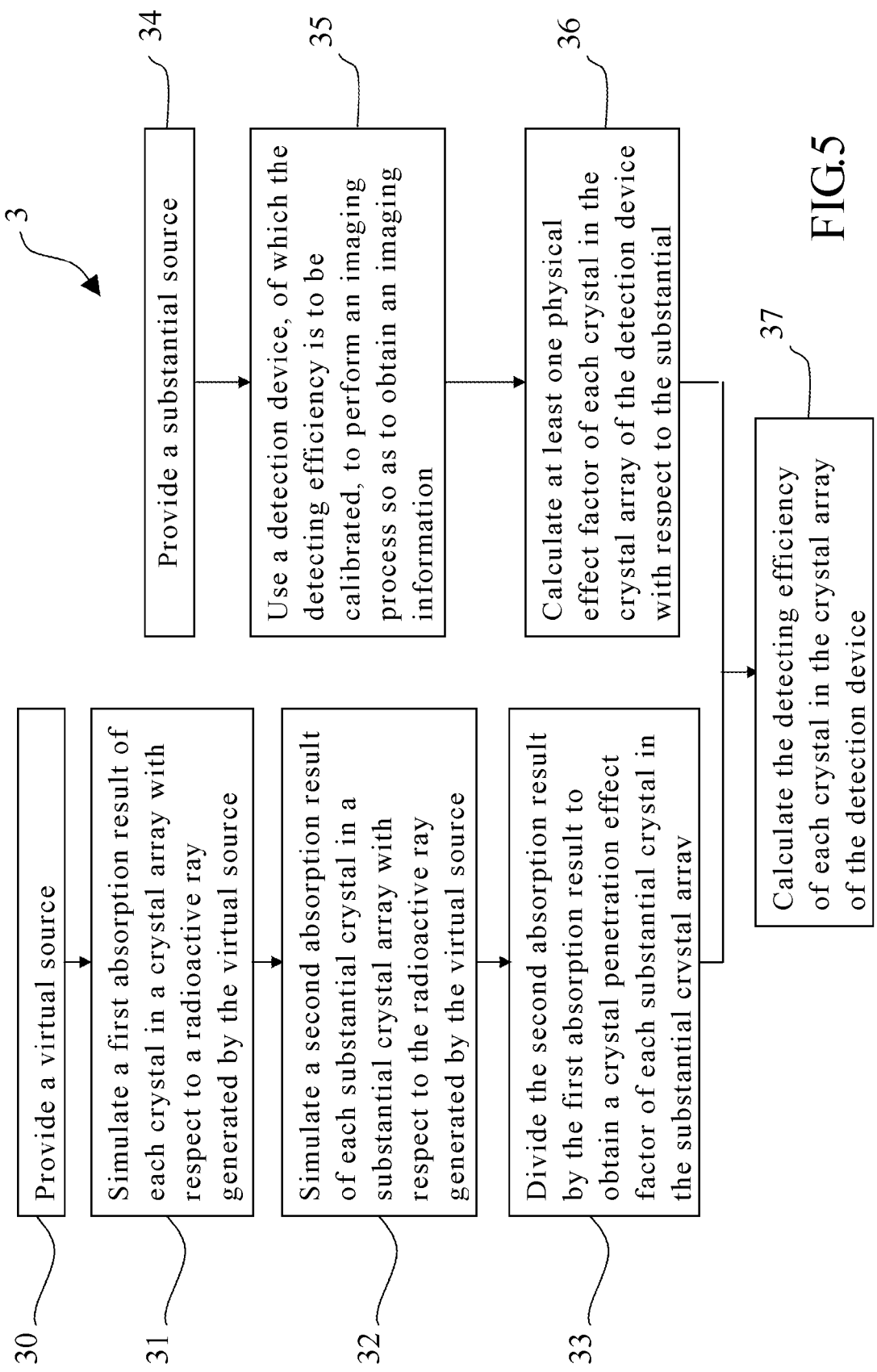

METHOD FOR CALIBRATING THE CRYSTAL-LEVEL DETECTION EFFICIENCY

FIELD OF THE INVENTION

The present invention generally relates to a technology of calibrating the crystal-level detection efficiency in a scintillation detector and, more particularly, to a method capable of evaluating the influences caused by the penetration effect so as to calculate the difference of detection efficiency between crystals correctly and thereby calibrate the difference between crystals appropriately.

BACKGROUND OF THE INVENTION

Nuclear medicine imaging modalities are injecting radioisotopes into a bio-body, and detecting the gamma rays emitted by the radioisotopes so that the distribution of the radioisotopes in the bio-body can be known. Accordingly, the function of tissues and organs can be diagnosed.

A scintillation detector can be used to detect ionizing radiation such as gamma rays and is composed of scintillation crystals, photomultiplier tubes (PMTs) and electronic circuits. As the gamma rays and scintillation crystals interact to emit scintillation photons, the scintillation photons are converted into electrons and amplified by PMTs. Then the electronic circuits perform signal processing. During the imaging process, the acquired signals are influenced by the different efficiency of scintillation crystals, PMTs, and electronic circuits. To minimize the influence and improve the imaging quality, the detection efficiency of the scintillation detector or imaging apparatuses thereof such as gamma cameras, positron imaging apparatus, positron emission tomography (PET), single photon imaging apparatus, single photon emission computed tomography (SPECT), etc. has to be calibrated so as to avoid error information due to the difference in detection efficiency between crystals.

The method of crystal-level detection efficiency calibration is realized by performing an imaging process to a uniform radiation source by the scintillation detector or imaging apparatuses thereof. Then the interaction signals of the crystals with the gamma rays are accumulated so as to calculate and calibrate the detection efficiency of the crystals. Conventionally, the ring-shaped imaging system such as positron imaging apparatus for imaging the human body and the rotary single photon imaging apparatus with parallel-hole or approximately parallel-hole collimators can generally uses point sources, uniform cylindrical sources or rotary planar sources for efficiency calibration with good results. With the trend of personalized medicine, specialized imaging apparatuses with specific functions has become more popular. Therefore, the non ring-shaped imaging system and the single photon imaging system with non parallel-hole collimator (such as pinhole or multi-pinhole collimator) have become more and more important. Since the non ring-shaped system and ring-shaped system, parallel-hole collimator and non parallel-hole collimator are geometrically differently designed, it is important to develop a detection efficiency calibration technology that is applicable to non ring-shaped system and non parallel-hole collimator system.

For example, FIG. 1 is a schematic diagram of a conventional ring-shaped imaging system. As shown in FIG. 1, the conventional ring-shaped imaging system 9 comprises a ring-shaped detection module 94 composed of a plurality of crystals 92 (only one crystal is indicated as an example). The detection efficiency of the ring-shaped imaging system 9 is calibrated with the gamma rays 91 generated by a gamma-ray source 90 being incident vertically onto the crystal 92 so that the crystal penetration effect does not bring forth significant influence. Therefore, in such a conventional ring-shaped detection method, the influence caused by the crystal penetration effect is not taken into consideration when calculating the crystal efficiency. However, in a non ring-shaped system, as shown in FIG. 2, since the gamma rays 91 generated by the gamma-ray source 90 may be incident onto the crystal with a larger incoming angle, the influence caused by the crystal penetration effect is not negligible. The crystal penetration effect is correlated to the interaction between the gamma rays and the crystals. It is not necessarily that scintillation photons are generated immediately once the gamma rays are incident on the crystals. It is more probable that scintillation photons are generated after the gamma rays have entered the crystals for a certain depth. Therefore, the crystal that generates scintillation photons is not necessarily the first crystal that receives the gamma rays. For example, in FIG. 2, the gamma ray 91 enters the crystal C on the surface thereof and is detected in the crystal A due to penetration. Therefore, if the influence caused by the crystal penetration effect is not calibrated, misjudgment on the position of the gamma ray happens. It follows that the difference of the efficiency between the crystals can not be calibrated correctly, which results in poor resolution and contrast of the imaging result to adversely affect the imaging quality and worsen the difficulty in diagnosis.

SUMMARY OF THE INVENTION

The present invention provides a method for evaluating the influence of crystal penetration effect, using substantial crystalline materials and virtual materials with an extremely high attenuation coefficient to perform Monte Carlo simulation to obtain simulation results with and without penetration effects. By comparing the above two simulation results, the influence of the crystal penetration effect can be acquired to calculate the crystal-level detection efficiency and improve calibration accuracy. The method can be applied without modifying the hardware design and consequently the design cost, manpower cost and time cost can be reduced.

In one embodiment, the present invention provides a method for evaluating the influence of penetration effect on crystals of a scintillation detector, comprising steps of: providing a virtual source; simulating a first absorption result of each crystal in a crystal array with respect to a radioactive ray generated by the virtual source, the crystal array comprising a plurality of crystals arranged therein and each crystal comprising a crystalline material characterized in that the radioactive ray is immediately absorbed once it enters the crystalline material; simulating a second absorption result of each substantial crystal in a substantial crystal array with respect to the radioactive ray generated by the virtual source; and dividing the second absorption result by the first absorption result to obtain a crystal penetration effect factor of each substantial crystal in the substantial crystal array.

In another embodiment, the present invention provides a method for evaluating the crystal-level detection efficiency, comprising steps of: providing a virtual source; simulating a first absorption result of each crystal in a crystal array with respect to a radioactive ray generated by the virtual source, the crystal array comprising a plurality of crystals arranged therein and each crystal comprising a crystalline material characterized in that the radioactive ray is immediately absorbed once it enters the crystalline material; simulating a second absorption result of each substantial crystal in a substantial crystal array with respect to the radioactive ray generated by the virtual source; dividing the second absorption result by the first absorption result to obtain a crystal penetration effect factor of each substantial crystal in the substantial crystal array; providing a substantial source; using a detection device, of which the detection efficiency is to be calibrated, to perform an imaging process so as to obtain an imaging information, the detection device having a crystal array comprising a crystalline material similar to that of the simulated substantial crystal array; calculating at least one physical effect factor of each crystal in the crystal array of the detection device with respect to the substantial source; and calculating the detection efficiency of each crystal in the crystal array of the detection device according to the at least one physical effect factor, the imaging information and the crystal penetration effect factor.

In another embodiment, the present invention provides a method for calibrating the crystal-level detection efficiency, comprising steps of: providing a virtual source; simulating a first absorption result of each crystal in a crystal array with respect to a radioactive ray generated by the virtual source, the crystal array comprising a plurality of crystals arranged therein and each crystal comprising a crystalline material characterized in that the radioactive ray is immediately absorbed once it enters the crystalline material; simulating a second absorption result of each substantial crystal in a substantial crystal array with respect to the radioactive ray generated by the virtual source; dividing the second absorption result by the first absorption result to obtain a crystal penetration effect factor of each substantial crystal in the substantial crystal array; providing a substantial source; using a detection device, of which the detection efficiency is to be calibrated, to perform an imaging process so as to obtain an imaging information, the detection device having a crystal array comprising a crystalline material similar to that of the substantial crystal array; calculating at least one physical effect factor of each crystal in the crystal array of the detection device with respect to the substantial source; calculating the detection efficiency of each crystal in the crystal array of the detection device according to the at least one physical effect factor, the imaging information and the crystal penetration effect factor; and calibrating the detection efficiency of each substantial crystal in the substantial crystal array.

BRIEF DESCRIPTION OF THE DRAWINGS

The objects and spirits of the embodiments of the present invention will be readily understood by the accompanying drawings and detailed descriptions, wherein:

FIG. 5 is a flow chart of a method for evaluating the crystal-level detection efficiency according to one embodiment of the present invention;

DETAILED DESCRIPTION OF THE PREFERRED EMBODIMENT

The present invention can be exemplified but not limited by various embodiments as described hereinafter.

Figure 1:
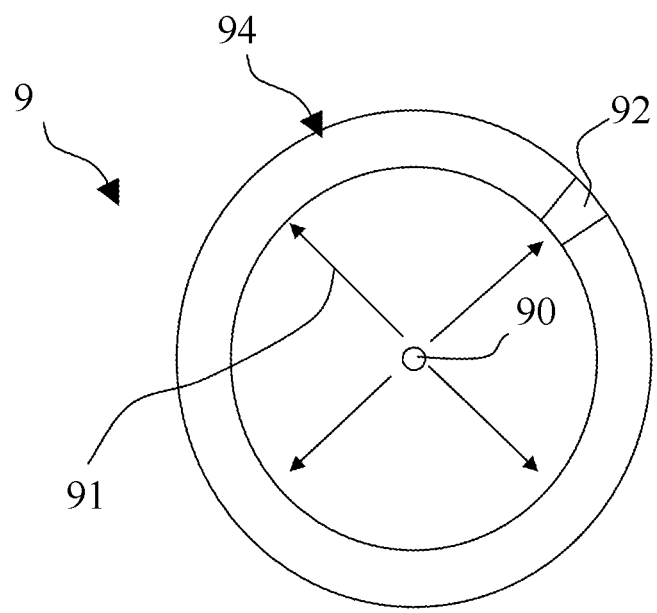
FIG. 1 is a schematic diagram of a conventional ring-shaped detection imaging system.
Figure 2:
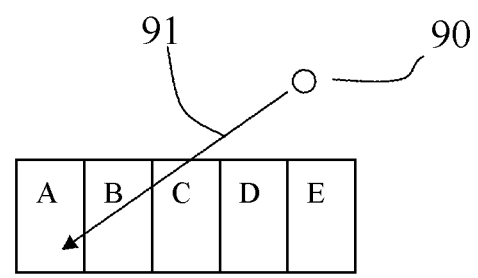
FIG. 2 is a schematic diagram of a radioactive ray penetrating crystals.
Figure 3:
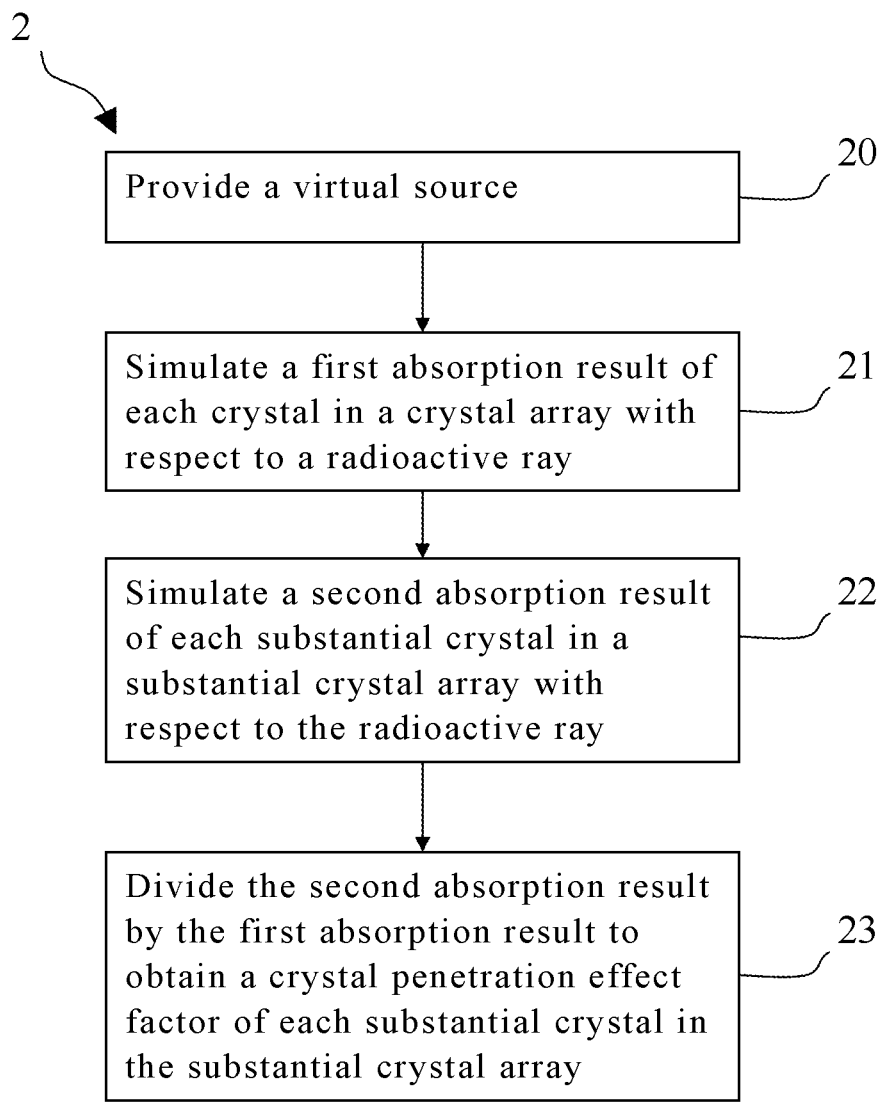
FIG. 3 is a flow chart of a method for evaluating the influence of penetration effect on crystals according to one embodiment of the present invention.

Please refer to FIG. 3, which is a flow chart of a method for evaluating the influence of penetration effect on crystals according to one embodiment of the present invention. In the present embodiment, the method 2 for evaluating the influence of penetration effect on crystals comprises steps hereinafter. First, in step 20, a virtual source is provided. The virtual source can be a gamma-ray source or an X-ray source, but not limited thereto. The virtual source in the present embodiment is a gamma point source to generate uniform radioactive rays, which can be simulated by software. Such simulation is well known to those with ordinary in the art, and thus description thereof is not presented herein. Then, in step 21, a first absorption result of each crystal in a crystal array is simulated with respect to radioactive rays generated by the virtual source. The crystal array comprises a plurality of crystals arranged therein. Each crystal comprises a crystalline material characterized in that a radioactive ray is immediately absorbed once it enters the crystalline material. In this step, the arrangement of crystals in the crystal array is similar to that of the detection device to be substantially calibrated. The first absorption result is simulated by Monte Carlo simulation, but not limited thereto, as long as utilized simulation is able to simulate the interaction between the radioactive ray and the scintillation crystals.

In step 21, for non-penetration simulation, a virtual material with an attenuation coefficient of $10^8$ cm$^{-1}$ is set. The virtual material is used as the crystalline material in step 21. It is noted that the attenuation coefficient is not limited to the setting in the present embodiment. It can provide a quite good result if the attenuation coefficient is designated more than about 50 cm$^{-1}$. However, since the attenuation coefficient influences the absorptivity, it can be designated as high as possible, for example, more than $10^8$ cm$^{-1}$. However, the range of this value accepted by simulation software has to be taken into account. The present invention is not limited to the range of this value depending on simulation software.

Figure 4A:
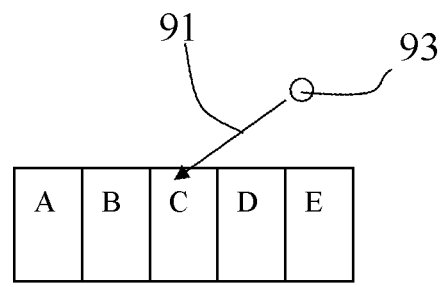
FIG. 4A is a schematic diagram of a radioactive ray being absorbed immediately by crystals.

Therefore, in FIG. 4A, the crystalline material comprises a virtual material with an extremely high attenuation coefficient and exhibits a high absorptivity with respect to the gamma ray 91 generated by the virtual source 93 so that the gamma ray is absorbed immediately once it enters the crystals. Therefore, the penetration effect of crystals can be eliminated when such crystalline material is used for simulation, as is expressed in equation (1):

$$c_i^{sim1} = A \times f_i^{SimOther}, \quad 1 \leq i \leq N \quad (1)$$

wherein N denotes the number of crystals in the crystal array, $c_i^{sim1}$ denotes the first absorption result in step 21 detected by the $i^{th}$ crystal; A denotes the source activity for simulation; and $f_i^{SimOther}$ denotes the influence upon the $i^{th}$ crystal caused by effects other than the crystal penetration effect. The effects other than the crystal penetration effect include geometric effects, attenuation effects, etc. based on the physical model of simulation software.

Figure 4B:
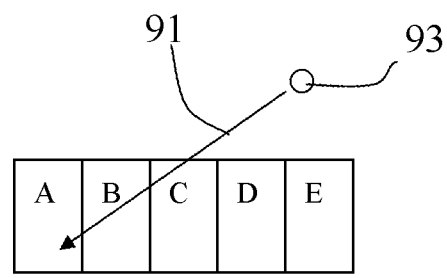
FIG. 4B is a schematic diagram of a radioactive ray penetrating crystals.

Then, in step 22, a second absorption result of each substantial crystal in a substantial crystal array is simulated with respect to the radioactive ray generated by the virtual source. The substantial crystal array comprises a plurality of substantial crystalline materials arranged therein. The arrangement of crystals in the crystal array is similar to that of the detection device to be substantially calibrated. The substantial crystalline materials comprise scintillation crystalline materials such as cerium doped lutetium orthosilicate (LSO), cerium doped lutetium yttrium orthosilicate (LYSO) and bismuth germanate (BGO). In the present invention, the scintillation crystals are not limited to the above three materials. The crystalline materials for simulation should match the crystals used in the detection device to be substantially calibrated. As shown in FIG. 4B, since a substantial crystalline material is used for simulation, the crystal penetration effect takes place when a radioactive ray enters the crystal C, penetrates the crystals C and B, and then is detected in the crystal A. Therefore, in step 22, the same source is used with substantial crystalline materials for simulation to acquire the following result, as expressed in equation (2), which includes the influence caused by the crystal penetration effect.

$$c_i^{sim2} = A \times f_i^{SimOther} \times f_i^{cp}, \quad 1 \leq i \leq N \quad (2)$$

wherein $c_i^{sim2}$ denotes the second absorption result in step 22 detected by the $i^{th}$ crystal; and $f_i^{cp}$ denotes the influence upon the $i^{th}$ crystal caused by effect. Similarly, $f_i^{SimOther}$ the crystal penetration denotes the influence upon the $i^{th}$ crystal caused by effects other than the crystal penetration effect.

Then, in step 23, the second absorption result is divided by the first absorption result to obtain a crystal penetration effect factor of each substantial crystal in the substantial crystal array. The influence of the penetration effect on the $i^{th}$ crystal is expressed in equation (3):

$$f_i^{cp} = \frac{c_i^{sim2}}{c_i^{sim1}}, \quad 1 \leq i \leq N \quad (3)$$

During an efficiency detection experiment, the results detected by each crystal depend on the following factors, the crystal-level detection efficiency, the source activity, the crystal penetration effect, and at least one physical effect factor. The crystal-level detection efficiency depends on the scintillation efficiency of each scintillation crystal and the properties of each PMT and electronic element. The detection efficiency calibration is to compensate the difference. The at least one physical effect factor can be geometric factors, scattering, positron range, other physical effects other than the penetration effect of crystals and combination of the above.

Based on the influence of penetration effect on crystals, the present invention further provides a method for evaluating the crystal-level detection efficiency. Please refer to FIG. 5, which is a flow chart of a method for evaluating the crystal-level detection efficiency according to one embodiment of the present invention. The steps 30 to 33 are similar to steps 20 to 23 in FIG. 3 and descriptions thereof are not presented herein. In the flow chart in FIG. 5, the method further comprises steps herein. In step 34, a substantial source is provided. The shape, size, position and type of the substantial source are similar to those of the virtual source in step 30. In the present embodiment, the substantial source is a gamma-ray source, but not limited thereto. Then in step 35, a detection device, of which the detection efficiency is to be crystal-level calibrated, is used to perform an imaging process so as to obtain imaging information $c_i^{exp}$. The crystal array used in the detection device is the substantial crystal array in step 32. The detection device comprises scintillation detectors, photomultiplier tubes (PMTs), and electronic circuits that comprise scintillation crystal arrays. The detection device is well known to those with ordinary skill in the art, and thus description thereof is not presented herein. The detection device can be a positron imaging detection device or an X-ray source, a single photon imaging detection device or an X-ray imaging detection device that can detect radioactive rays, but is not limited thereto. Then in step 36, the influence $f_i^{other}$ of at least one physical effect is evaluated. The at least one physical effect is one effect other than the penetration effect and is well known to those with ordinary skill in the art, and thus description thereof is not presented herein. It is noted that $f_i^{other}$ and $f_i^{SimOther}$ in equations (1) and (2) are not the same because not all the physical phenomena can be simulated by simulation software. At last, step 37 is performed to calculate the detection efficiency of the $i^{th}$ crystal in the substantial crystal array, as expressed in equation (4):

$$Eff_i = c_i^{exp} / (f_i^{cp} \times f_i^{other}) \quad (4)$$

Figure 6:
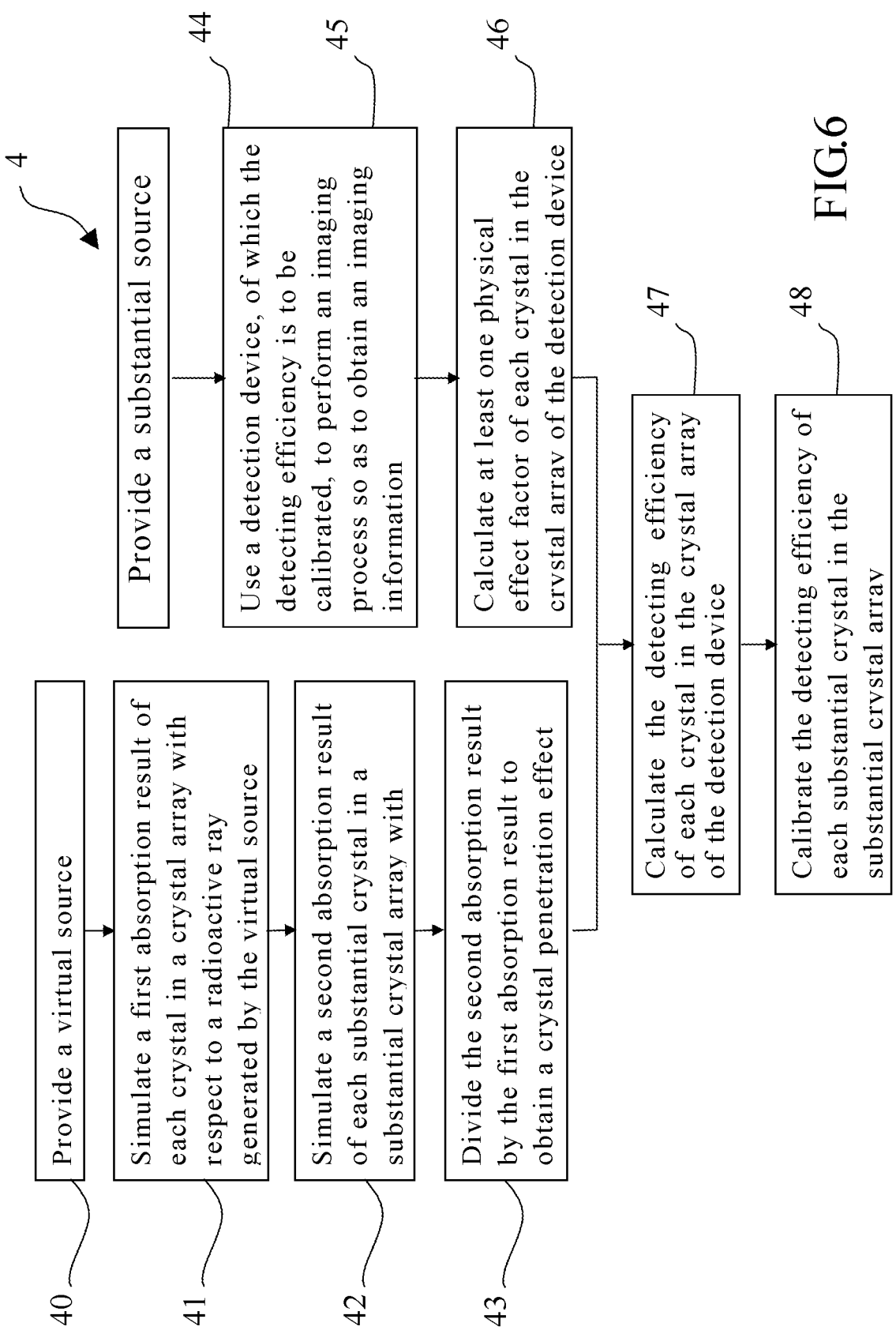
FIG. 6 is a flow chart of a method for calibrating the crystal-level detection efficiency according to one embodiment of the present invention.
Figure 7A:
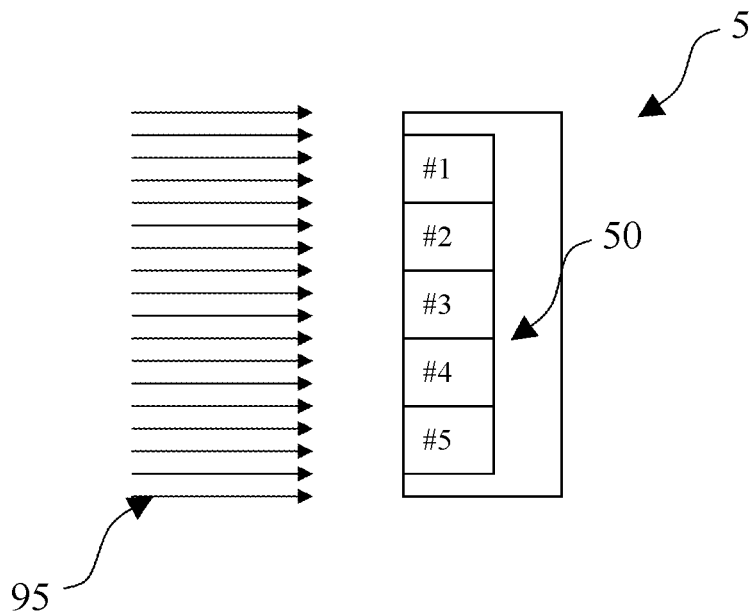
FIG. 7A and FIG. 7B are schematic diagrams showing calibrating the crystal-level detection efficiency according to the present invention.

In equation (4), $Eff_i$ denotes the detection efficiency of the $i^{th}$ crystal. The larger value of $Eff_i$ indicates that the radioactive ray (such as gamma ray) is more easily detected by the crystal. For example, if $Eff_{10}$ is twice the $Eff_{15}$, it indicates that the count of signal detected by the $10^{th}$ crystal is twice the count of signal detected by the $15^{th}$ crystal. By the result of $Eff_i$ in equation (4), the flow chart in FIG. 6 can be proceeded, wherein FIG. 6 is a flow chart of a method for calibrating the detection efficiency in crystal level according to one embodiment of the present invention. Steps 40 to 47 in FIG. 6 are similar to steps 30 to 37 in FIG. 5. However, in FIG. 6, step 48 is performed to calibrate the detection efficiency of each substantial crystal in the substantial crystal array by equation (4). Please refer to FIG. 7A and FIG. 7B for schematic diagrams showing calibrating the detection efficiency in crystal level according to the present invention. Label 95 in denotes uniform and parallel gamma rays. Assuming that there are five crystals #1~#5 with the same size in a crystal array 50 in a detection device 5, the detection efficiency of these five crystals are provided in Table 1, wherein $Eff_1$ to $Eff_5$ denote the crystal efficiency, respectively.

TABLE 1

| $Eff_1$ | $Eff_2$ | $Eff_3$ | $Eff_4$ | $Eff_5$ |
|---|---|---|---|---|
| 3.0 | 1.5 | 0.9 | 1.2 | 1.6 |

When the detection device 5 is used to detect a gamma-ray source capable of generating parallel and uniform gamma rays at a far end, the probability for each crystal being hit by gamma rays is identical. Since the detection efficiency of each crystal may differ, for example, the results detected by the crystals are shown in Table 2, wherein $Count_1$ to $Count_5$ represent the counts detected by crystals #1~#5.

TABLE 2

| $Count_1$ | $Count_2$ | $Count_3$ | $Count_4$ | $Count_5$ |
|---|---|---|---|---|
| 3000 | 1500 | 900 | 1200 | 1600 |

Figure 7B:
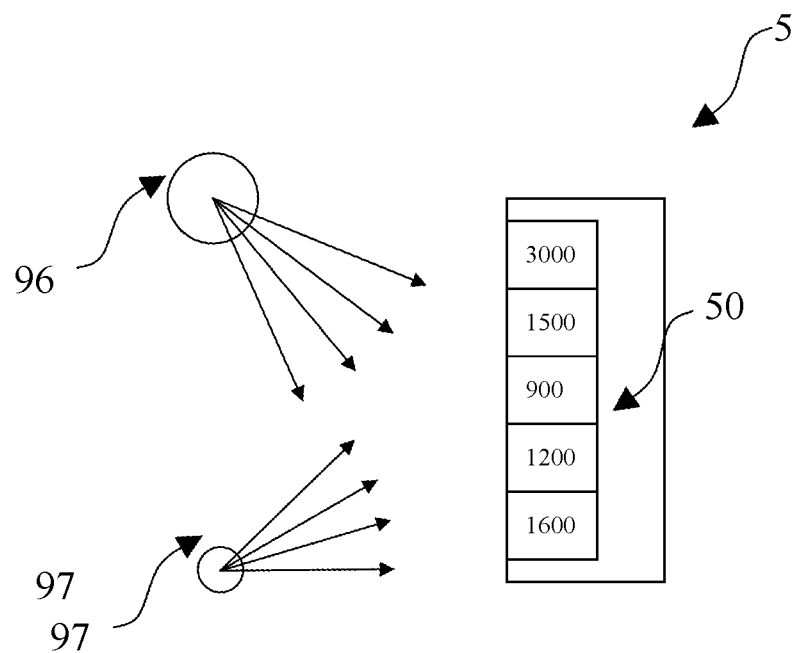

Table 2 shows the results when the detection efficiency is not calibrated. However, Table 2 may mislead that there are a strong source 96 and a weak source 97 arranged vertically as shown in FIG. 7B, which results in higher values for the crystal #1 and the crystal #5 and lower value for the crystal #3. In fact, this is attributed to the difference in detection efficiency between the crystals. Accordingly, the original value for each crystal has to be calculated with the detection efficiency $Eff_i$ by equation (4) so as to acquire a calibrated result that can truly reflect the condition of the sources as shown in Table 3. In the present embodiment, the calibrated detecting result is acquired by dividing the original value for each crystal by the detection efficiency. It is noted that the present invention is not limited to such division calculation. Moreover, the $Eff_i$ value can be inversed and then multiplied with the original value for each crystal so that the highest part of detection efficiency is reduced and the lowest part is enhanced.

Therefore, the method for calibrating is not limited to division calculation. The detection efficiency calibration based on $Eff_i$ can be achieved by hardware such as electronic circuits or software.

TABLE 3

| $Count_1/$ $Eff_1$ | $Count_2/$ $Eff_2$ | $Count_3/$ $Eff_3$ | $Count_4/$ $Eff_4$ | $Count_5/$ $Eff_5$ |
|---|---|---|---|---|
| 1000 | 1000 | 1000 | 1000 | 1000 |

Although the present invention has been disclosed and illustrated with reference to particular embodiments, the principles involved are susceptible for use in numerous other embodiments that will be apparent to persons skilled in the art. The present invention is, therefore, to be limited only as indicated by the scope of the appended claims.

What is claimed is:

1. A method for evaluating an influence of penetration effect on crystals of a scintillation detector, comprising steps of:
   providing a virtual radiation source;
   simulating, with an electronic circuit, a first absorption result of a first crystal in a first crystal array with respect to radioactive rays generated by the virtual radiation source, the first crystal array comprising a plurality of crystals each crystal comprising a virtual crystalline material characterized in that the radioactive rays are immediately absorbed upon entering the virtual crystalline material;
   simulating, with said electronic circuit, a second absorption result of a second crystal in a second crystal array with respect to the radioactive rays generated by the virtual radiation source, the second crystal array comprising a plurality of crystals, each crystal comprising an actual crystalline material; and
   obtaining a crystal penetration effect factor of the second crystal in the second crystal array by dividing the second absorption result by the first absorption result.

2. The method for evaluating the influence of penetration effect on crystals of a scintillation detector as recited in claim 1, wherein the virtual radiation source is a gamma-ray source, an X-ray source or a radiation particle source.

3. The method for evaluating the influence of penetration effect on crystals of a scintillation detector as recited in claim 1, wherein the first absorption result and the second absorption result are simulated by Monte Carlo simulation.

4. The method for evaluating the influence of penetration effect on crystals of a scintillation detector as recited in claim 1, wherein the virtual crystalline material is designated to have an attenuation coefficient more than 50 cm$^{-1}$, and the radioactive rays are absorbed immediately by the virtual crystalline material without penetration once the virtual crystalline material receives the radioactive rays.

5. A method for evaluating a crystal-level detection efficiency of a scintillation detector, comprising steps of:
   providing a virtual radiation source;
   simulating, with an electronic circuit, a first absorption result of a first crystal in a first crystal array with respect to radioactive rays generated by the virtual radiation source, the first crystal array comprising a plurality of crystals each crystal comprising a virtual crystalline material characterized in that the radioactive rays are immediately absorbed upon entering the virtual crystalline material;
   in accordance with a detection device, of which the detection efficiency is to be calibrated, simulating a second absorption result of a second crystal in a second crystal array with respect to the radioactive rays generated by the virtual radiation source, the second crystal array comprising a plurality of crystals, each crystal comprising an actual crystalline material;
   obtaining a crystal penetration effect factor of said second crystal in the second crystal array by dividing the second absorption result by the first absorption result;
   providing an actual radiation source;
   using said detection device to perform an imaging process so as to obtain an imaging information, the detection device having a third crystal array comprising a crystalline material identical to that of said second crystal array;
   calculating at least one physical effect factor of a third crystal in the third crystal array with respect to the actual radiation source; and
   calculating the detection efficiency of the third crystal according to the at least one physical effect factor, the imaging information and the crystal penetration effect factor.

6. The method for evaluating the crystal-level detection efficiency as recited in claim 5, wherein the virtual radiation source and the actual radiation source are gamma-ray sources.

7. The method for evaluating the crystal-level detection efficiency as recited in claim 5, wherein the first absorption result and the second absorption result are simulated by Monte Carlo simulation.

8. The method for evaluating the crystal-level detection efficiency as recited in claim 5, wherein the at least one physical effect factor is calculated based on geometric effects, attenuation effects, positron range effects or collimator effects.

9. The method for evaluating the crystal-level detection efficiency as recited in claim 5, wherein the detection device is a positron imaging detection device, a single photon imaging detection device or a X-ray imaging detection device.

10. The method for evaluating the crystal-level detection efficiency as recited in claim 5, wherein the virtual crystalline material is designated to have an attenuation coefficient more than 50 cm$^{-1}$, and the radioactive rays are absorbed immediately by the virtual crystalline material without penetration once the virtual crystalline material receives the radioactive rays.

11. A method for calibrating a crystal-level detection efficiency of a scintillation detector, comprising steps of:
   providing a virtual radiation source;
   simulating, with an electronic circuit, a first absorption result of a first crystal in a first crystal array with respect to radioactive rays generated by the virtual radiation source, the first crystal array comprising a plurality of crystals, each crystal comprising a virtual crystalline material characterized in that the radioactive rays are immediately absorbed upon entering the virtual crystalline material;

in accordance with a detection device, of which the detection efficiency is to be calibrated, simulating a second absorption result of a second crystal in a second crystal array with respect to the radioactive rays generated by the virtual radiation source, the second crystal array comprising a plurality of crystals, each crystal comprising an actual crystalline material;

obtaining a crystal penetration effect factor of said second crystal in the second crystal array by dividing the second absorption result by the first absorption result;

providing an actual radiation source;

using the detection device to perform an imaging process so as to obtain an imaging information, the detection device having a third crystal array comprising a crystalline material identical to that of said second crystal array;

calculating at least one physical effect factor of a third crystal in the third crystal array with respect to the actual radiation source;

calculating the detection efficiency of the third crystal according to the at least one physical effect factor, the imaging information and the crystal penetration effect factor; and calibrating the detection efficiency of the third crystal.

12. The method for calibrating the crystal-level detection efficiency as recited in claim 11, wherein the radiation virtual source and the actual radiation source are gamma-ray sources.

13. The method for calibrating the crystal-level detection efficiency as recited in claim 11, wherein the first absorption result and the second absorption result are simulated by Monte Carlo simulation.

14. The method for calibrating the crystal-level detection efficiency as recited in claim 11, wherein the at least one physical effect factor is calculated based on geometric effects, attenuation effects, positron range effects or collimator effects.

15. The method for calibrating the crystal-level detection efficiency as recited in claim 11, wherein the detection device is a positron imaging detection device, a single photon imaging detection device or an X-ray imaging detection device.

16. The method for calibrating the crystal-level detection efficiency as recited in claim 11, wherein the virtual crystalline material is designated to have an attenuation coefficient more than 50 $cm^{-1}$, and the radioactive rays are absorbed immediately by the virtual crystalline material without penetration once the virtual crystalline material receives the radioactive rays.

17. The method for calibrating the crystal-level detection efficiency as recited in claim 11, wherein the detection efficiency of the third crystal is calibrated by performing a calculation on the detection results of the actual radiation source detected by the third crystal and the detection efficiency of the third crystal so as to obtain a calibrated detection result.

* * * * *